United States Patent
Karstens

(10) Patent No.: US 7,522,414 B2
(45) Date of Patent: Apr. 21, 2009

(54) APPARATUS FOR EXTENDING AN OPERATOR PANEL

(75) Inventor: Christopher Kent Karstens, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/751,957

(22) Filed: May 22, 2007

(65) Prior Publication Data

US 2008/0291624 A1   Nov. 27, 2008

(51) Int. Cl.
*H05K 7/20* (2006.01)
*H01L 23/40* (2006.01)

(52) U.S. Cl. .............. 361/690; 361/681; 361/683; 361/695; 454/184

(58) Field of Classification Search ............... 361/361, 361/679, 683–686, 687, 690–697, 724–727; 454/184; 312/223.2, 223.3, 293.1, 293.2, 312/293.3, 3.301, 206; 165/121–126, 104.33, 165/185
See application file for complete search history.

(56) References Cited

U.S. PATENT DOCUMENTS

| | | | |
|---|---|---|---|
| 4,093,021 A | | 6/1978 | Groom |
| 5,388,032 A | * | 2/1995 | Gill et al. ............ 700/17 |
| 6,144,549 A | * | 11/2000 | Moss et al. ............ 361/681 |
| 6,246,580 B1 | | 6/2001 | Weng |
| 6,297,446 B1 | | 10/2001 | Cherniski et al. |
| 6,452,788 B1 | * | 9/2002 | Crowley ............ 361/683 |
| 6,924,977 B2 | | 8/2005 | Bestwick et al. |
| 2005/0030712 A1 | | 2/2005 | Faneuf et al. |
| 2005/0237710 A1 | | 10/2005 | Chen |
| 2006/0092608 A1 | | 5/2006 | Liang et al. |
| 2006/0139879 A1 | | 6/2006 | Holmes et al. |
| 2006/0238974 A1 | * | 10/2006 | Musgrave et al. ............ 361/695 |

\* cited by examiner

*Primary Examiner*—Michael V Datskovskiy
(74) *Attorney, Agent, or Firm*—Yee & Associates, P.C.; Mark E. McBurney

(57) ABSTRACT

An apparatus for extending an operator panel away from an electronic device. An opening in a side of a housing for the electronic device is covered with an air intake grill to provide airflow for cooling at least one electronic component within the electronic device. The operator panel that controls operation or displays a status of the electronic device is attached to a mounting element. The mounting element defines an air gap of a predetermined distance between the operator panel and the opening in the side of the housing to provide increased airflow into the housing for optimal heat dissipation for the electronic device. Then, the mounting element is connected to the housing and the operating panel is coupled to the electronic device.

9 Claims, 7 Drawing Sheets

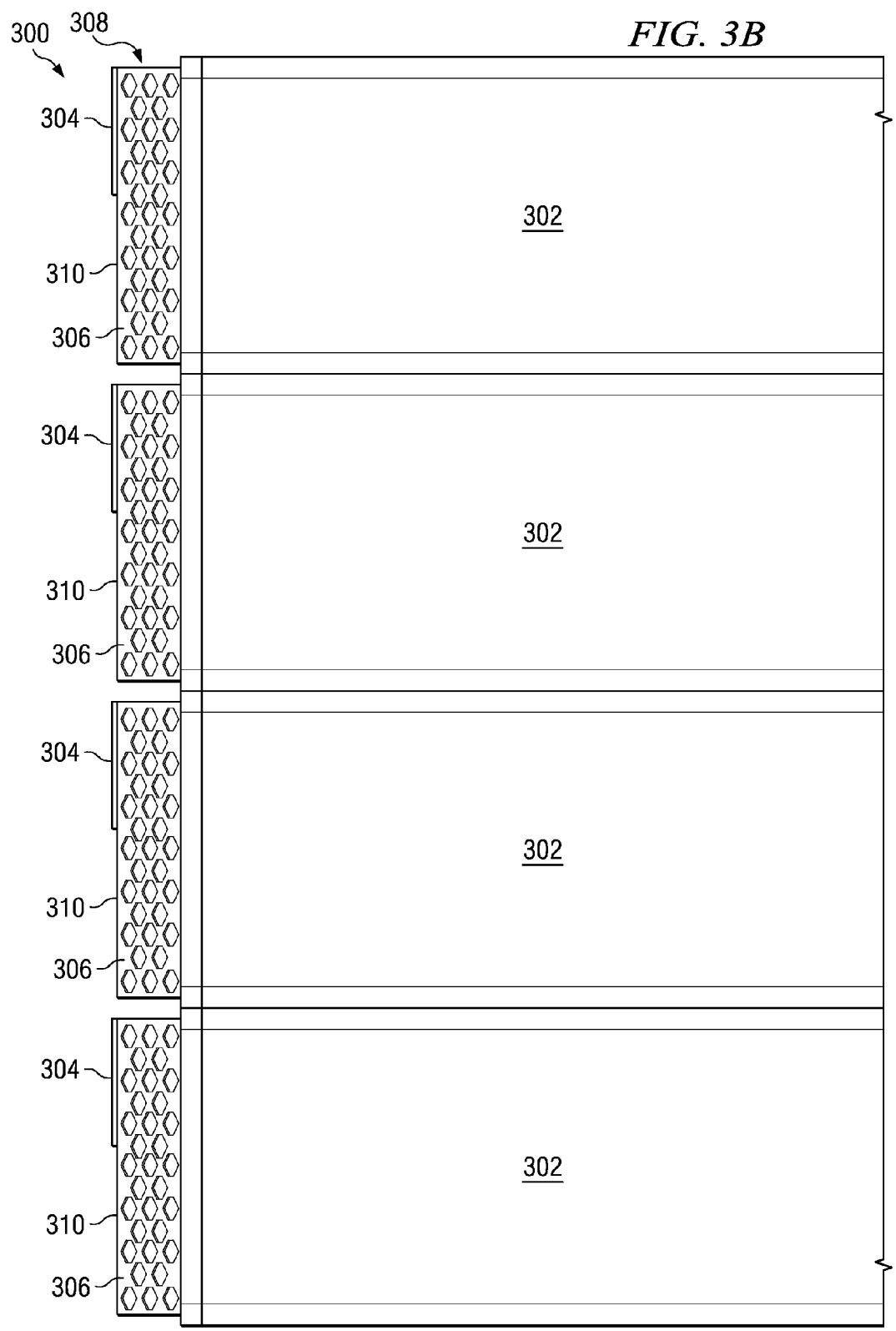

APPARATUS FOR EXTENDING AN OPERATOR PANEL

BACKGROUND OF THE INVENTION

1. Field of the Invention

The present invention relates generally to an improved apparatus for thermal energy dissipation in an electronic device. More specifically, the present invention is directed to an apparatus and method for extending an operator panel away from an electrical device to provide a gap between the electronic device and the operator panel for increased airflow to more efficiently dissipate heat.

2. Description of the Related Art

As electronic devices increase in processing power and speed, their processors generate more and more heat. This increased heat generation increases wear and tear on various components within the electronic devices and compromises overall performance. Such temperature-related problems will only continue to grow as processor speeds continue in an upward direction. Therefore, cooling of these processors, and other heat producing elements, has become an important issue affecting the performance of modern electronic devices, such as computers.

As a result, methods have been created in the past to reduce the operating temperatures of these electronic devices. For example, various liquid cooling systems have been employed to cool processors with water or other types of liquids. However, liquid cooling systems are typically bulky, expensive, and upon leaking may cause a risk of severe damage to the electronic devices in which such systems are installed.

Another common solution to the problem of excessive heat generation is to install fans within the electronic devices for air cooling. Even though internal fans are relatively inexpensive and do not suffer from some of the drawbacks of liquid cooling systems, high-performance electronic devices typically require a plurality of fans and increased air intake for adequate component cooling. However, many electronic devices today have an operator panel located on the same plane as the face of the electronic device, which reduces the amount of possible air intake surface area. Consequently, electronic devices with such operator panels may suffer from inadequate airflow to reduce heat buildup. As a result of the inadequate airflow, these electronic devices may be damaged or the processor may automatically be throttled down to operate at a slower speed to reduce heat buildup.

Therefore, it would be beneficial to have an improved apparatus and method for extending an operator panel away from the face of an electronic device to provide an air gap between the electronic device and the operator panel for increased airflow into the electronic device, which in turn increases dissipation of heat produced by electronic elements within the electronic device.

BRIEF SUMMARY OF THE INVENTION

Illustrative embodiments provide a method and apparatus for extending an operator panel away from an electronic device. An opening in a side of a housing for the electronic device is covered with an air intake grill to provide airflow for cooling at least one electronic component within the electronic device. The operator panel that controls operation or displays a status of the electronic device is attached to a mounting element. The mounting element defines an air gap of a predetermined distance between the operator panel and the opening in the side of the housing to provide increased airflow into the housing for optimal heat dissipation for the electronic device. Then, the mounting element is connected to the housing and the operating panel is coupled to the electronic device.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIGS. 3A and 3B are a pictorial representation of a plurality of electronic devices that extend a plurality of operator panels using a plurality of contoured air intake grills in accordance with an illustrative embodiment.

DETAILED DESCRIPTION OF THE INVENTION

With reference now to the figures and in particular with reference to FIGS. 1-3, exemplary diagrams of electronic devices are provided in which illustrative embodiments may be implemented. It should be appreciated by those of ordinary skill in the art that FIGS. 1-3 are only exemplary and are not intended to assert or imply any limitation with regard to the electronic devices in which different embodiments may be implemented. Many modifications to the depicted electronic devices may be made.

Illustrative embodiments provide a method and apparatus for extending an operator panel away from an electronic device. An opening in a side of a housing for the electronic device is covered with an air intake grill to provide airflow for cooling at least one electronic component within the electronic device. The operator panel, which displays the status of the electronic device and/or controls the operation and function of the electronic device, is attached to a mounting element. Some operator panels, such as, for example, select rear operator panels on legacy servers or blade chassis, only display information regarding the electronic device and do not control operation or function of the electronic device.

Illustrative embodiments use the mounting element to extend the operator panel away from the electronic device. The mounting element may, for example, be a bracket or a contoured portion of the air intake grill. The bracket may, for example, be an L shaped bracket. The mounting element supports the control panel and defines an air gap of a predetermined distance, such as, for example, one half inch to one inch, between the operator panel and the opening in the side of the housing to provide increased airflow into the housing for optimal heat dissipation of thermal energy producing components within the electronic device. Then, the mounting element is connected to the housing and the operator panel is coupled to the electronic device.

Thus, illustrative embodiments, by moving the operator panel away from the same plane as the front side of the electronic device's housing by using a mounting device, increases the amount of air intake surface area for the electronic device. However, some select electronic devices have an operator panel on the rear side of the electronic device instead of, or in addition to, the operator panel on the front side. As a result, illustrative embodiments may move the operator panel away from the same plane as the back side of the electronic device's housing to increase the amount of air exhaust surface area for the electronic device. Consequently, electronic devices utilizing illustrative embodiments have increased airflow to reduce heat buildup of thermal producing components. As a result, electronic devices utilizing illustrative embodiments may decrease thermal wear and tear on electronic components and increase overall performance by allowing the processor to operate at a higher speed for longer periods.

Figure 1A:
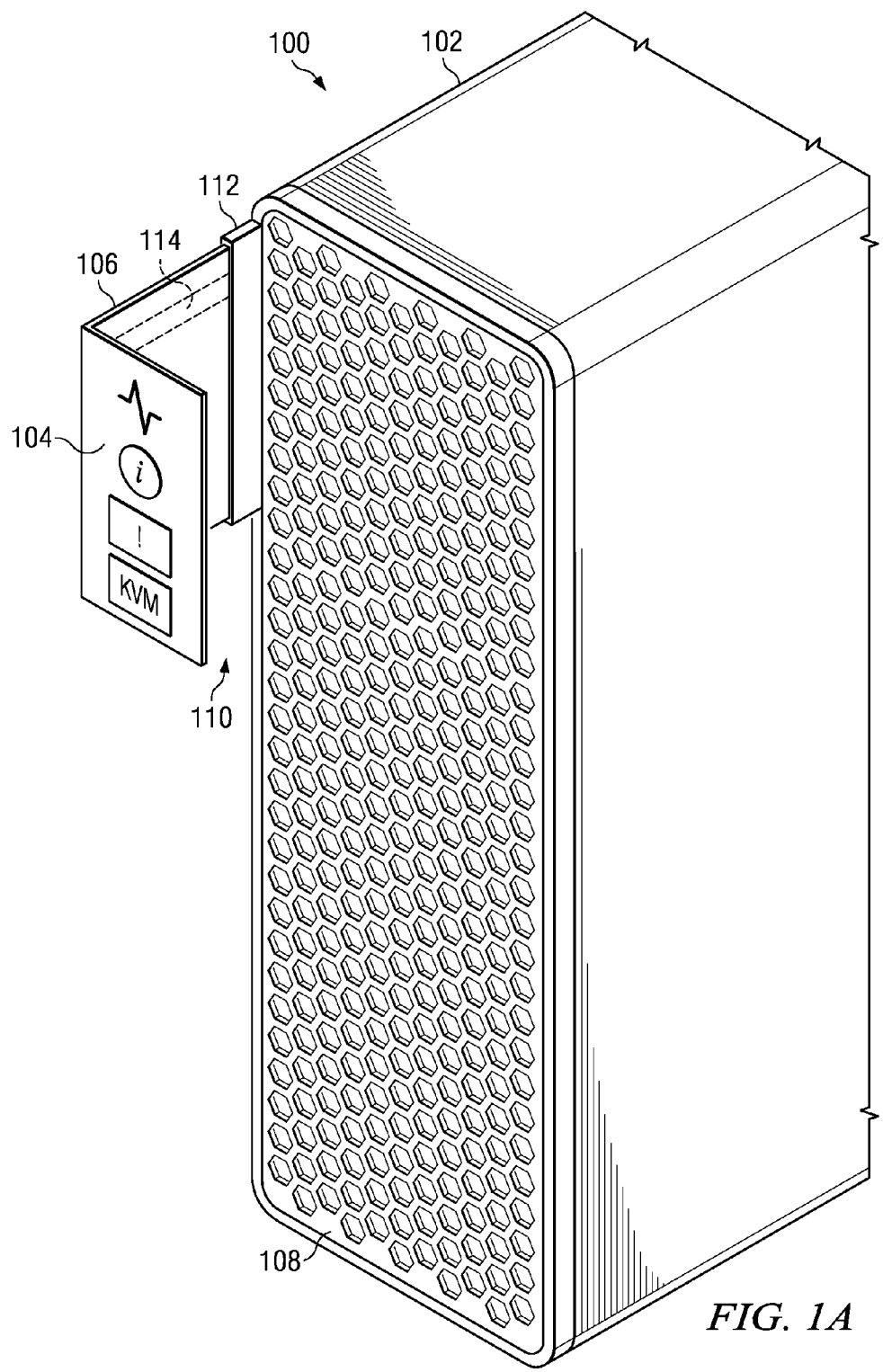
FIGS. 1A and 1B are a pictorial representation of an electronic device that extends an operator panel using a bracket in accordance with an illustrative embodiment.
Figure 1B:
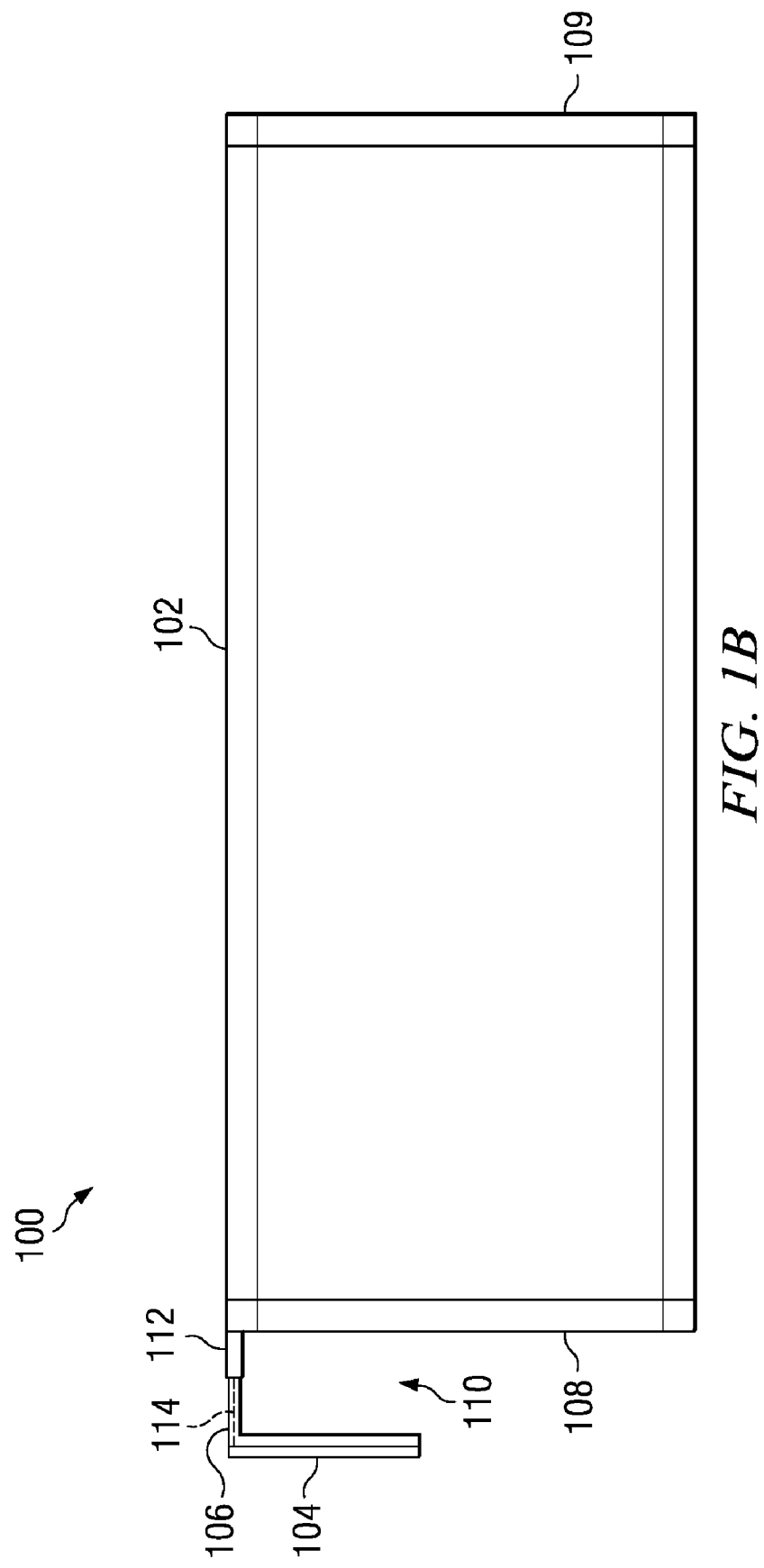

With reference now to FIGS. 1A and 1B, a pictorial representation of an electronic device that extends an operator panel using a bracket is depicted in accordance with an illustrative embodiment. FIG. 1A is an offset view and FIG. 1B is a top view of electronic device 100. Electronic device 100 is an electronic device that is cooled by air. Electronic device 100 may, for example, be a blade server. In addition, electronic device 100 may represent one of a plurality of electronic devices in an enclosure, such as, for example, a plurality of blade servers in a blade center chassis.

Blade servers are self-contained computer servers, designed for high density. In addition, blade servers may have many components removed for space, power, and other considerations while still having all the functional components to be considered a computer. A blade center chassis, or enclosure, provides services, such as power, cooling, networking, various interconnects, and management. Together these components and services form the blade system.

The enclosure, or chassis, performs many of the non-core computing services found in most computers. By locating these services in one place and sharing them between the blade computers, overall utilization is more efficient. In addition, the enclosure may remove heat from the blades by utilizing one or more turbine blowers connected to the enclosure, itself.

However, illustrative embodiments are not limited to electronic device 100 only being a blade server. Electronic device 100 may represent other types of electronic devices, such as, for example, network switches, rack servers, legacy servers, hard drive assemblies, computers, and the like. In other words, illustrative embodiments may be used with any electronic device that includes an operator panel.

Electronic device 100 includes housing 102 and operator panel 104. Housing 102 represents any type of housing, casing, or chassis that may house one or more electronic components that comprise electronic device 100. Housing 102 includes one or more openings in one or more sides to provide an airflow path for cooling the one or more electronic components within electronic device 100. In addition, housing 102 may be any dimension or shape. In other words, housing 102 is not restricted to the dimensions and shape of the example shown in FIG. 1.

Operator panel 104 is a panel display for an operator of electronic device 100 to monitor and operate electronic device 100 activities and functions. The operator by using operator panel 104 may monitor activities, such as processor speed, processor power utilization, processor temperature, temperature of other electronic components, and electronic component faults, for electronic device 100. In addition, the operator by using operator panel 104 may operate functions, such as power on, power off, and reset, for electronic device 100.

Operator panel 104 may be a high-resolution micro display, such as, for example, an organic light-emitting diode (OLED) display. An OLED is any light-emitting diode whose emissive electroluminescent layer comprises a film of organic compounds. The layer usually contains a polymer substance that allows suitable organic compounds to be deposited. The organic compounds are deposited in rows and columns onto a flat carrier by a simple "printing" process. The resulting matrix of pixels may emit light of different colors.

In addition, operator panel 104 may include touch screen capabilities. Further, operator panel 104 may be of a sub-millimetric measurement in width. However, it should be noted that illustrative embodiments may utilize any type of operator panel.

Operator panel 104 is attached to bracket 106 and bracket 106 connects to housing 102. Operator panel 104 is coupled to electronic device 100 via wire or wireless means. Bracket 106 may be made of any type of material and may be in any shape. However, in this particular example, bracket 106 is an L shaped bracket.

Front side air intake grill 108 is an air intake grill that covers the opening in the front side of housing 102, while enabling airflow through the opening. Front side air intake grill 108 may, for example, completely cover the entire front side of housing 102 to maximize airflow into electronic device 100. However, it should be noted that front side air intake grill 108 may cover any portion of the front side of housing 102.

Moreover, front side air intake grill 108 includes a plurality of grill openings arranged in a common pattern. In this particular example, the common pattern is a honeycomb pattern of grill openings. Furthermore, housing 102 may include back side air exhaust grill 109, which may be similar in size, shape, and pattern to front side air intake grill 108.

Bracket 106 supports operator panel 104 and is positioned on housing 102 to define air gap 110. Air gap 110 is a gap, or space, of air, which is of a predetermined distance, between operator panel 104 and front side air intake grill 108, which covers the front side opening of housing 102. Air gap 100 provides increased airflow into housing 102 by extending operator panel 104 away from the same plane as the front side of housing 102 for maximum heat dissipation for heat producing components within electronic device 100.

The predetermined distance for air gap 110 is a distance that was determined by a system administrator, a computer, or by both to be the optimal distance for allowing maximum heat dissipation for electronic device 100. This predetermined distance may fall within a predetermined range of distances. For example, the range of distances may include a minimum distance of one quarter inch and a maximum distance of two inches. However, the optimal predetermined distance for air gap 110 is within a range from one half inch to one inch. It should be noted that the maximum air gap distance may be affected by a clearance between extended operator panel 104 and a door for an enclosure, such as, for example, a blade center chassis door, which contains electronic device 100.

Bracket 106 may be connected to housing 102 anywhere on housing 102 as long as the predetermined distance for air gap 110 is maintained between operator panel 104 and front side air intake grill 108. In other words, illustrative embodiments are not restricted to positioning bracket 106 in the location shown in FIG. 1. In addition, bracket 106 may be adjustable for defining a plurality of different air gaps between operator panel 104 and the front side opening in housing 102. In other words, a system administrator or operator of electronic device 100 may adjust air gap 110 within the predetermined range in order to enhance performance of electronic device 100 as needed. Alternatively, electronic device 100 may automatically adjust air gap 110 via an electronic motor based on thermal conditions.

The system administrator or operator may adjust air gap 110 by adjusting the length of bracket 106 using, for example, adjustable telescoping sleeve 112. However, it should be noted that adjustable telescoping sleeve 112 is only shown for the purpose of illustration and is not meant as a limitation on illustrative embodiments. Illustrative embodiments may utilize any type of adjusting mechanism to adjust the length of bracket 106. Moreover, bracket 106 may include hollow portion 114 to allow wires to pass protected between operator panel 104 and electronic device 100.

Figure 2A:
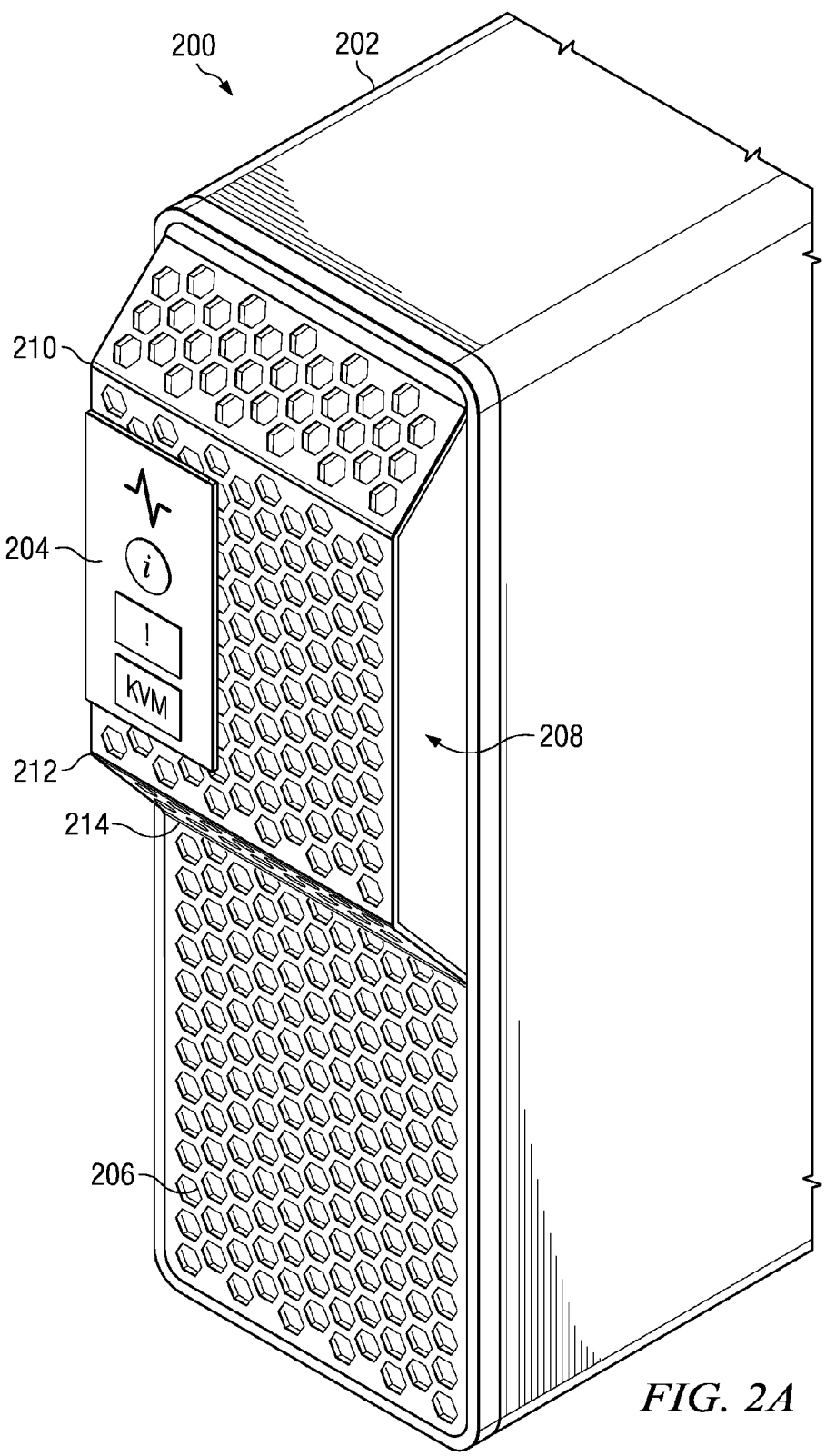
FIGS. 2A and 2B are a pictorial representation of an electronic device that extends an operator panel using a contoured air intake grill in accordance with an illustrative embodiment.
Figure 2B:
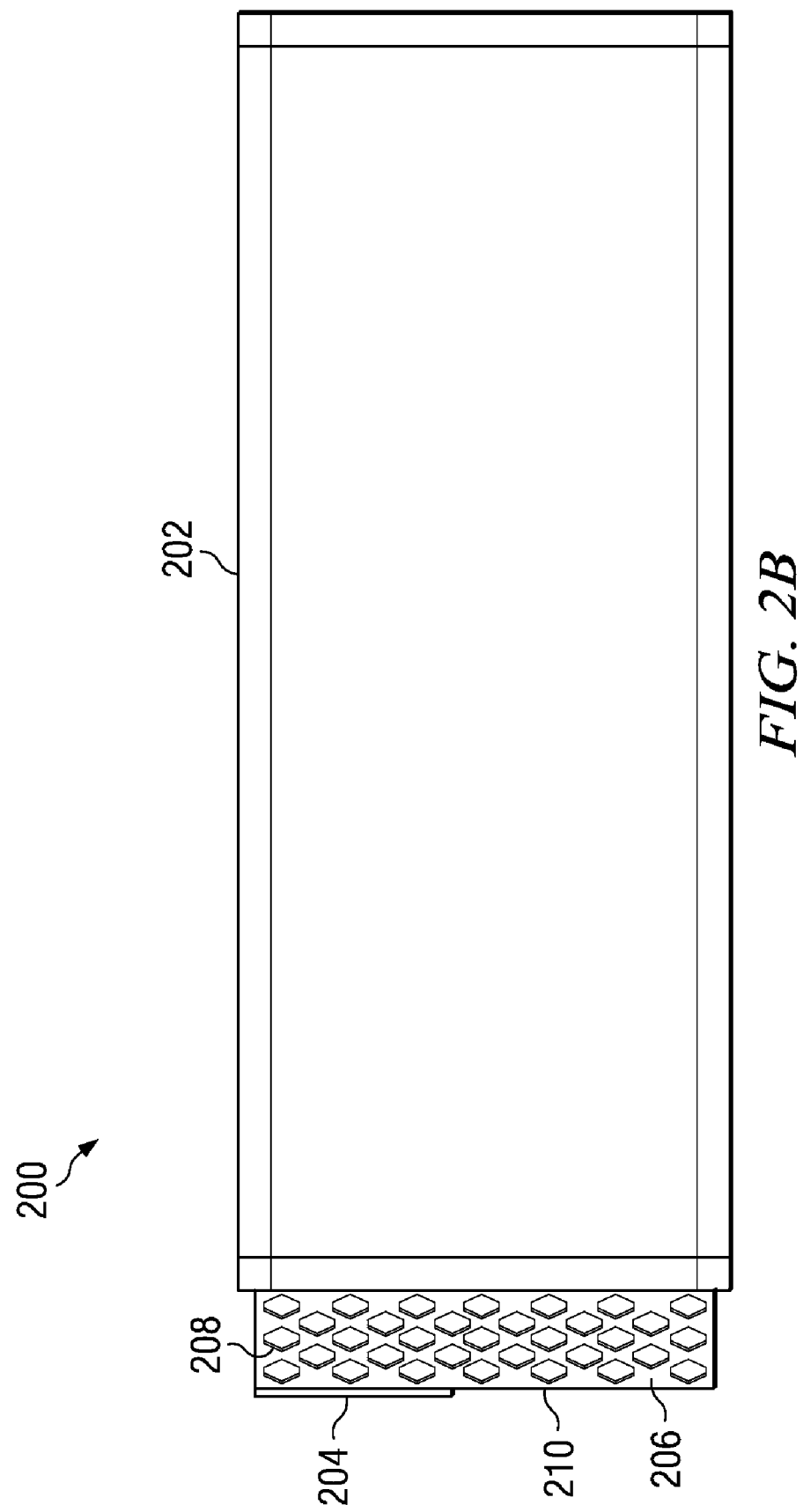

With reference now to FIGS. 2A and 2B, a pictorial representation of an electronic device that extends an operator panel using a contoured air intake grill is depicted in accordance with an illustrative embodiment. FIG. 2A is an offset view and FIG. 2B is a top view of electronic device 200. Electronic device 200 may, for example, be electronic device 100 in FIGS. 1A and 1B.

Electronic device 200 includes housing 202, such as housing 102 in FIGS. 1A and 1B, and operator panel 204, such as operator panel 104 in FIGS. 1A and 1B. Operator panel 204 is attached to front side contoured air intake grill 206. Front side contoured air intake grill 206 has at least a portion of the air intake grill contoured, as opposed to front side air intake grill 108 in FIGS. 1A and 1B, which is flat.

Front side contoured air intake grill 206 covers the front side opening in housing 202. In addition, front side contoured air intake grill 206 is the mounting element in these examples of FIGS. 2A and 2B. In other words, bracket 106 in FIGS. 1A and 1B is not necessary for this illustrative embodiment because front side contoured air intake grill 206 extends operator panel 204 away from the same plane as the front side of housing 202.

Front side contoured air intake grill 206 is contoured in such a way as to define air gap 208, such as air gap 110 in FIGS. 1A and 1B, between operator panel 204 and the front side opening in housing 202. In this particular example, the contour of at least a portion of front side contoured air intake grill 206 is formed by bend 210, bend 212, and bend 214. However, even though front side contoured air intake grill 206 is formed by 3 bends (bend 210, bend 212, and bend 214), illustrative embodiments are not restricted to such. Illustrative embodiments may form front side contoured air intake grill 206 by utilizing fewer or more bends in the air intake grill.

Figure 3A:
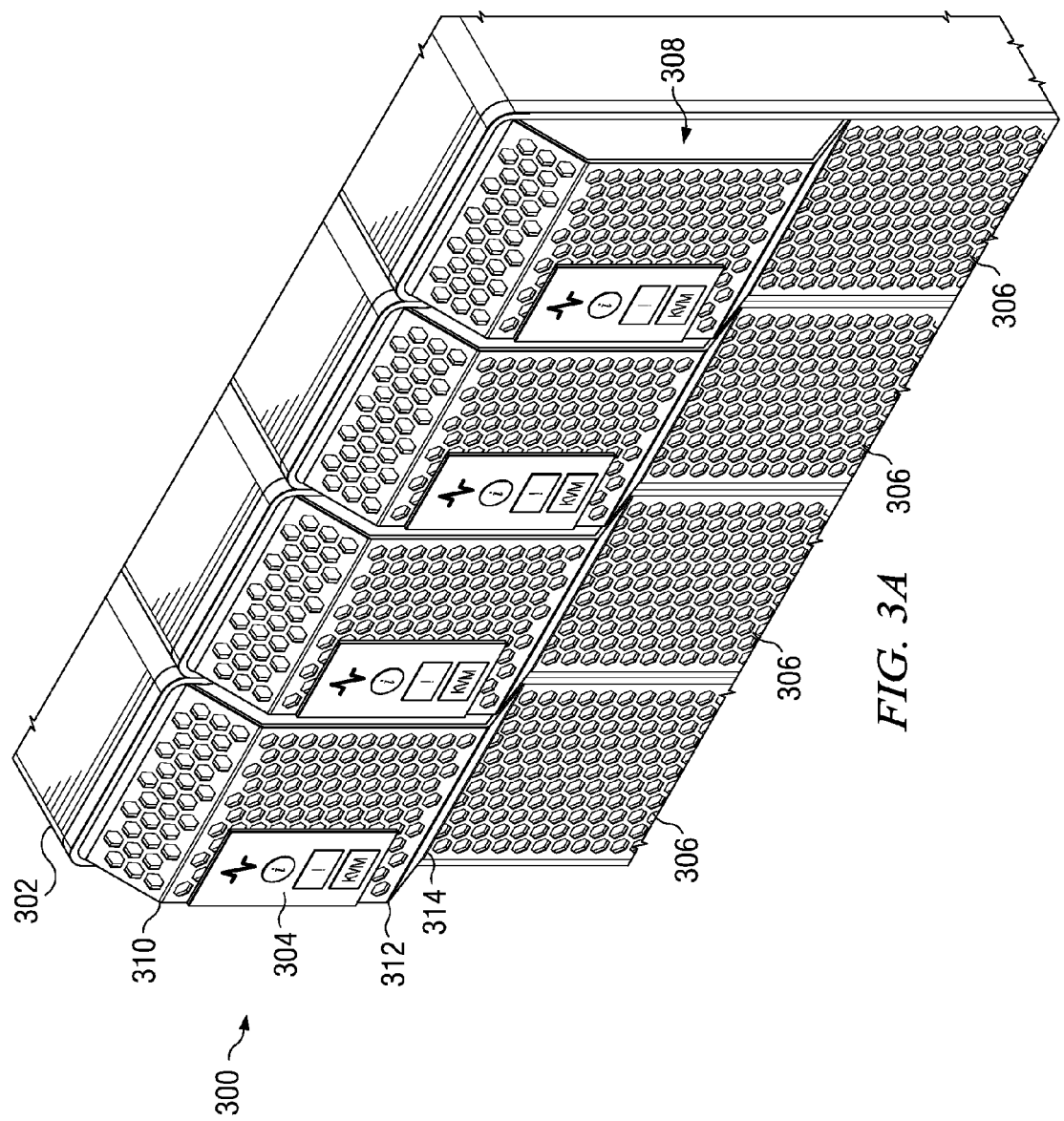

With reference now to FIGS. 3A and 3B, a pictorial representation of a plurality of electronic devices that extend a plurality of operator panels using a plurality of contoured air intake grills is depicted in accordance with an illustrative embodiment. FIG. 3A is an offset view and FIG. 3B is a top view of plurality of electronic devices 300. Plurality of electronic devices 300 may, for example, be a plurality of electronic device 200 in FIGS. 2A and 2B. In addition, plurality of electronic devices 300 may, for example, be a plurality of blade servers in a blade center chassis.

Plurality of electronic devices 300 includes plurality of housings 302, such as housing 202 in FIGS. 2A and 2B, and plurality of operator panels 304, such as operator panel 204 in FIGS. 2A and 2B. Plurality of operator panels 304 are attached to plurality of front side contoured air intake grills 306. Plurality of front side contoured air intake grills 306 are contoured air intake grills, such as front side contoured air intake grill 206 in FIGS. 2A and 2B.

Plurality of front side contoured air intake grills 306 are placed over the front side openings in plurality of housings 302. Plurality of front side contoured air intake grills 306 are contoured in such a way as to define plurality of air gaps 308, such as air gap 208 in FIGS. 2A and 2B, between plurality of operator panels 304 and the front side openings in plurality of housings 302. In this particular example, the contours of plurality of front side contoured air intake grills 306 are formed by bends 310, 312, and 314, such as bend 210, bend 212, and bend 214 in FIGS. 2A and 2B.

Figure 4:
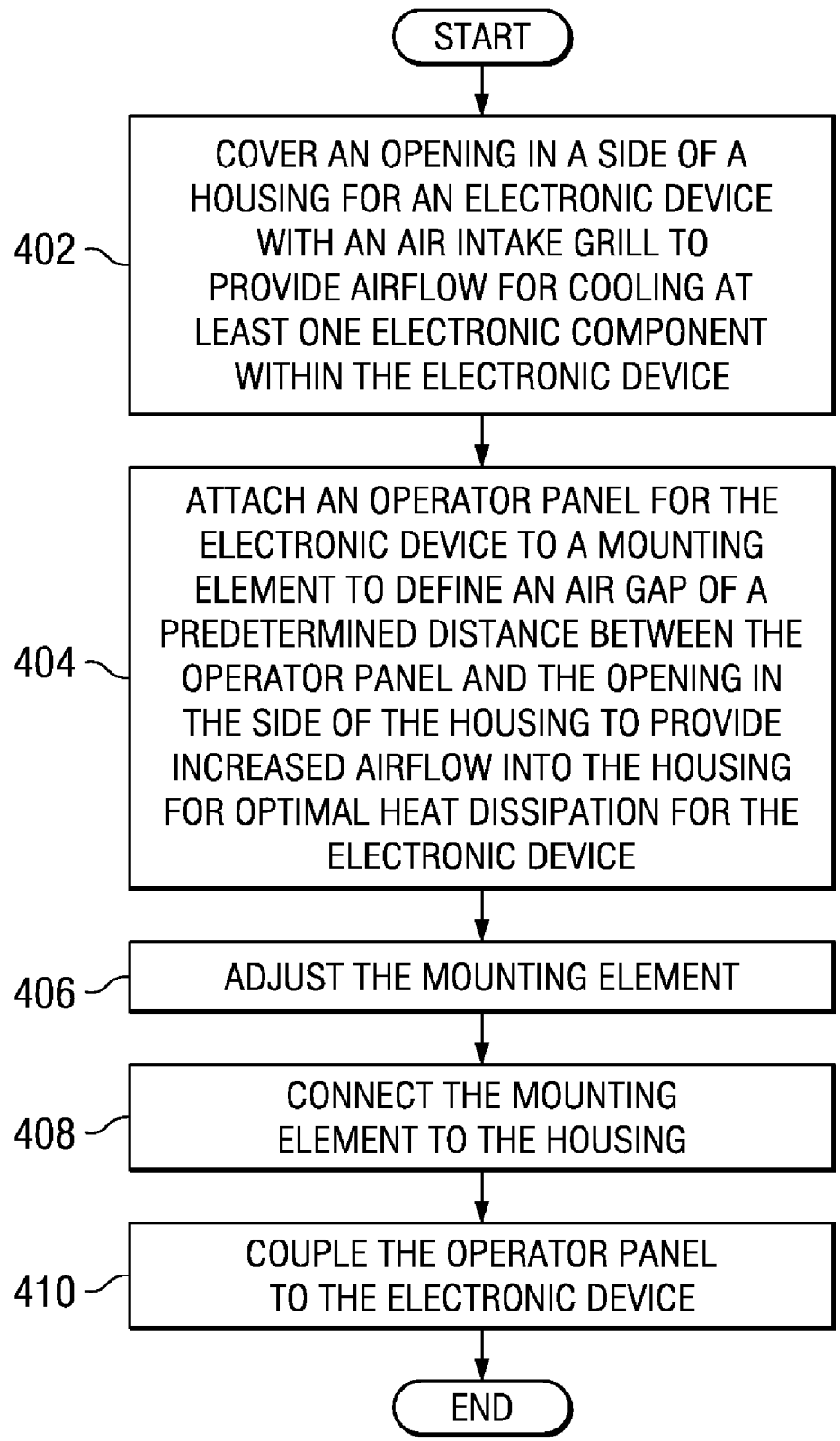
FIG. 4 is a flowchart illustrating an exemplary process for extending an operator panel away from an electronic device to increase airflow in accordance with an illustrative embodiment.

With reference now to FIG. 4, a flowchart illustrating an exemplary process for extending an operator panel away from an electronic device to increase airflow is shown in accordance with an illustrative embodiment. The process shown in FIG. 4 may be implemented in an electronic device, such as, for example, electronic device 100 in FIGS. 1A and 1B.

The process begins when an assembler, such as, for example, a person or a machine, covers an opening in a side of a housing, such as housing 102 in FIGS. 1A and 1B, for the electronic device with an air intake grill, such as front side air intake grill 108 in FIGS. 1A and 1B, to provide airflow for cooling at least one electronic component within the electronic device (step 402). Then, the assembler attaches an operator panel, such as operator panel 104 in FIGS. 1A and 1B, which controls the electronic device, to a mounting element, such as bracket 106 in FIGS. 1A and 1B, to define an air gap, such as air gap 110 in FIGS. 1A and 1B, of a predetermined distance between the operator panel and the opening in the side of the housing to provide increased airflow into the housing for optimal heat dissipation for the electronic device (step 404).

Afterward, the assembler adjusts the mounting element to the desired predetermined distance (step 406) and connects the mounting element to the housing (step 408). It should be noted that it is not important to illustrative embodiments as to where the mounting element is connected to the housing as long as the predetermined distance for the air gap is maintained between the operator panel and the opening in the side of the housing. Finally, the assembler couples the operator panel to the electronic device (step 410). The process terminates thereafter. However, it should be noted that even though the process shown in FIG. 4 follows a particular sequence of steps, the assembler may perform the steps in any order necessary.

Thus, illustrative embodiments provide a method and apparatus for extending an operator panel away from the face of an electronic device to create an air gap of a predetermined distance between the electronic device and the operator panel to provide increased airflow into the electronic device to increase dissipation of thermal energy produced by electronic components within the electronic device. The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An electronic device, comprising:
a housing containing at least one electronic component;

an opening in a side of the housing for providing an airflow path for cooling the at least one electronic component;

an air intake grill completely covering a front side of the housing to provide an increased open area for the airflow path, wherein the air intake grill includes a plurality of grill openings arranged in a common pattern;

an operator panel coupled to the electronic device for controlling operation or displaying a status of the electronic device, wherein the operator panel is supported at a predetermined distance from the opening for defining an air gap between the operator panel and the opening, wherein the air gap provides an increased airflow for optimal heat dissipation for the electronic device; and a bracket connected to the housing, wherein the bracket is adjustable for defining a plurality of different air gaps between the operator panel and the opening, and wherein the operator panel is attached to the bracket.

2. The electronic device of claim 1, wherein at least a portion of the air intake grill is contoured to form a contoured portion of the air intake grill, and wherein the control panel is supported at the predetermined distance from the opening by the contoured portion of the air intake grill, and wherein the operator panel is attached to the contoured portion of the air intake grill.

3. The electronic device of claim 1, wherein the common pattern is a honeycomb pattern.

4. The electronic device of claim 1, wherein the bracket includes a hollow portion to allow wires to pass protected between the operator panel and the electronic device.

5. The electronic device of claim 2, wherein the contoured portion of the air intake grill includes two or more bends.

6. The electronic device of claim 1, wherein the operator panel is an organic light-emitting diode display with touch screen capabilities.

7. The electronic device of claim 1, wherein the electronic device automatically adjusts the air gap using an electronic motor based on thermal conditions.

8. The electronic device of claim 1, wherein the electronic device is a blade server, and wherein the blade server is one of a plurality of blade servers in an enclosure.

9. The electronic device of claim 1, wherein the housing includes a back side air exhaust grill.

* * * * *